United States Patent [19]

Chen et al.

[11] Patent Number: 4,553,155
[45] Date of Patent: Nov. 12, 1985

[54] HIGH SPEED BIAS-FREE PHOTODETECTOR

[75] Inventors: Chung Y. Chen, Scotch Plains; Alfred Y. Cho, Summit, both of N.J.

[73] Assignee: AT&T Bell Laboratories, Murray Hill, N.J.

[21] Appl. No.: 592,724

[22] Filed: Mar. 22, 1984

Related U.S. Application Data

[63] Continuation of Ser. No. 389,778, Jun. 18, 1982.

[51] Int. Cl.$^4$ ............................................. H01L 27/14
[52] U.S. Cl. .......................................... 357/30; 357/16; 357/56; 357/4
[58] Field of Search ........................... 357/30, 16, 4, 56

[56] References Cited

U.S. PATENT DOCUMENTS

| | | | |
|---|---|---|---|
| 4,075,651 | 2/1978 | James | 357/16 X |
| 4,173,764 | 11/1979 | de Cremoux | 357/16 X |
| 4,194,935 | 3/1980 | Dingle et al. | 357/16 X |
| 4,257,055 | 3/1981 | Hess | 357/30 X |
| 4,258,375 | 3/1981 | Hsieh et al. | 357/30 X |
| 4,314,858 | 2/1982 | Tomasetta | 357/30 |

OTHER PUBLICATIONS

Hiyamizu et al., "High Mobility of Two-Dimensional Electrons at the GaAsIn—AlGaAs Heterojunction Interbase", *Appl. Phys. Lett.*, vol. 39, No. 9, pp. 805–807, Nov. 1980.

Mimura et al., "A New Field Effect Transistor with Selectively Dopant GaAsIn—Al$_x$Ga$_{1-x}$As Heterojunctions", *Jap. J. Appl. Phys.*, vol. 19, No. 5, pp. L225–L227, May 1980.

H. Melchior, "Detectors for Lightwave Communication," *Physics Today*, Nov. 1977, pp. 32–39.

F. Capasso et al., "InGaAsP/InGaAs Heterojunction p-i-n Detectors with Low Dark Current and Small Capacitance for 1.3–1.6 μm Fibre Optic Systems," *Electronics Letters*, vol. 16, No. 23, Nov. 6, 1980, pp. 893–895.

*Primary Examiner*—Martin H. Edlow
*Attorney, Agent, or Firm*—Richard D. Laumann

[57] ABSTRACT

A high speed bias-free photodetector which capacitively couples the output signal to an external circuit is described.

17 Claims, 4 Drawing Figures

HIGH SPEED BIAS-FREE PHOTODETECTOR

This application is a continuation of application Ser. No. 389,778, filed June 18, 1982.

TECHNICAL FIELD

This invention relates generally to photodetectors and particularly to photodetectors capable of operating without any bias voltage.

BACKGROUND OF THE INVENTION

The development of optical communication systems using silica-based optical fibers has stimulated great interest in light sources and photodetectors capable of operating within the wavelength region, generally between approximately 0.7 μm and approximately 1.6 μm, of interest to such systems. A photodetector is an essential component of such a system and as a result, much effort has been directed toward developing structures and materials for photodetectors.

The photodetectors presently contemplated for use with fiber-based optical communication systems are capable of high speed operation and fall into several general categories. First, there are p-i-n photodiodes. However, these suffer the drawback of not having any current gain. Second, avalanche photodiodes have been developed and these, of course, have current gain. However, the avalanche process introduces noise which is undesirable for many communication systems purposes. Third, phototransistors have been developed. However, these devices generally have low optical gain in the low incident power regime where optical communication systems operate and where high gain is most critically needed. Additionally, they generally have relatively slow speed because of minority carrier storage in the base region.

A high speed photodetector which does not require a bias voltage would be desirable for optical communication systems. The high speed photodetectors of the categories briefly described above usually require a bias voltage which is typically in the range between several volts and several hundred volts. For example, avalanche photodiodes generally require a bias voltage of at least 20 volts to enhance the avalanche process. Even p-i-n photodiodes are usually biased at several volts to obtain high speed response times. See for more details, for example, the article by H. Melchior on detectors for lightwave communication in *Physics Today*, pp. 32–39, November 1977.

Other photodetectors also have drawbacks associated with the presence of a bias voltage. For example, the bias voltage in p-n junction photodetectors increases the electric field and widens the depletion width and thus ensures that the optical absorption occurs in a region having a high electric field. While this eliminates the slow diffusion process of the carriers, it also gives rise to a d.c. dark current and hence contributes to shot noise, thereby degrading device characteristics. In general, the reverse bias leakage current depends exponentially on both the energy bandgap of the material and the ambient temperature. Consequently, problems associated with the magnitude of the leakage current can become especially severe for narrow bandgap materials. To some extent, the deleterious effects caused by these problems can be alleviated by placing the p-n junction in a higher bandgap material for a long wavelength detector having a very low dark current. See *Electronics Letter*, 16, pp. 893–895, 1980.

SUMMARY OF THE INVENTION

We have found that a photodetector comprising a first layer comprising a semiconductor having a first conductivity type; said first layer having at least one electrode for connection to an external electrical circuit; a second layer comprising a semiconductor having a second conductivity type; a semi-insulating substrate; said first and second layers forming a p-n junction and being disposed on said substrate, and an electrode contacting said substrate for connection to an external electrical circuit can operate at high speed without a bias voltage.

In one preferred embodiment, the photodetector comprises a semi-insulating substrate mounted on a conducting plane, and sequentially disposed on said substrate: a first epitaxial layer having a first conductivity type, a second epitaxial layer being nominally undoped, and a third epitaxial layer having a second conductivity type and at least one electrode. The second epitaxial layer is extremely thin and in the resulting modulation doped structure, the first epitaxial layer near the heterostructure interface is inverted, i.e., the intrinsic energy level bends downward and is below the Fermi level, and there is a potential well for a two-dimensional electron gas (2 DEG). When the 2 DEG has high electrical conductivity, it facilitates collection of photogenerated carriers at the electrical contact. This reduces the RC time constant that determines device response time. The semi-insulating substrate forms a capacitor between the first epitaxial layer and the conducting plane which is an electrode for connection to an external electrical circuit. The junction is thus capacitively coupled to an external electrical circuit through the semi-insulating substrate, i.e., through the capacitor. In another preferred embodiment, the first conductivity type is p-type and the second conductivity type is n-type. In yet another preferred embodiment, the first epitaxial layer comprises a Group III–V semiconductor such as GaAs and the second and third epitaxial layers comprise a Group III–V semiconductor such as $Al_xGa_{1-x}As$.

For reasons of clarity, the elements of the photodetector is depicted in the Figures are not necessarily drawn to scale.

DETAILED DESCRIPTION

Figure 1:
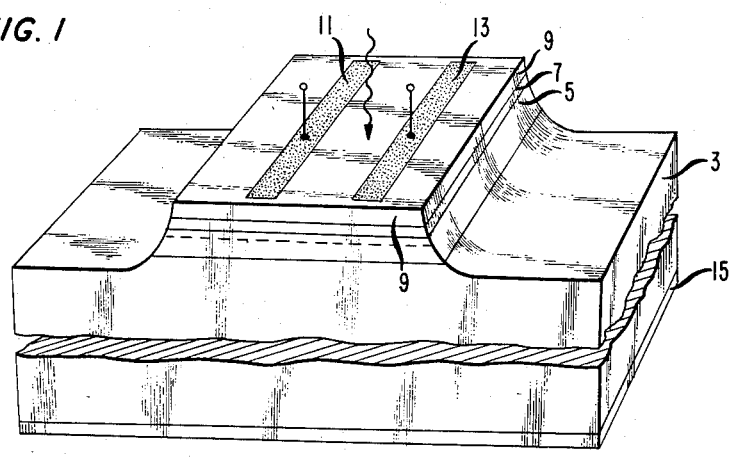
FIG. 1 is a sectional view of a photodetector according to this invention.

The invention will be first described by specific reference to an exemplary device according to this invention which is depicted in a perspective view in FIG. 1. The device, indicated generally as 1, comprises semi-insulating substrate 3, a first epitaxial layer 5 having a first conductivity type, a second epitaxial layer 7 having a first conductivity type, and a third epitaxial layer 9 having a second conductivity type. The device also comprises electrodes 11 and 13 on the third epitaxial layer 9 which are for connection to an external electrical circuit. Substrate 3 is mounted on electrically conducting layer 15, i.e., a conducting plane. The semi-insulating substrate 3 acts as a capacitor electrically connected to layer 5 and electrically conducting layer 15. Light, indicated as hv, is incident as shown. Substrate 3, which is semi-insulating, should have a resistivity greater than approximately $10^7$ Ωcm. A smaller resistivity will typically yield substrates that are too leaky. In the embodiment depicted, layer 7 is nominally undoped and extremely thin. In the resulting modulation doped structure, the portion of layer 5 near heterojunction interface is inverted and forms a potential well for a two-dimensional electron gas which is indicated by the dotted line. Electrodes 11 and 13 desirably are made by metallizations that directly contact the 2 DEG. The layers comprise, in a preferred embodiment, Group III-V compound semiconductors such as $In_xGa_{1-x}As_yP_{1-y}$ lattice matched to InP or $Al_xGa_{1-x}As$ lattice matched to GaAs. Other compounds, such as Group II-VI, may be used if they have different bandgaps and lattice match to each other.

Figure 2:
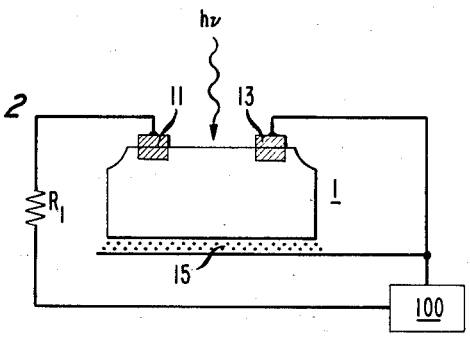
FIG. 2 is a schematic diagram of a preferred embodiment showing the electrical connections to an external electrical circuit.

A schematic diagram of a preferred embodiment showing the electrical connections between the photodetector and the external electrical circuit is shown in FIG. 2. Device 1 is electrically connected to utilization means 100, for example, a logic device, repeater, sampling oscilloscope, etc., through a microtransmission line. The detector is connected to one arm of the transmission line by layer 15 which is, for example, a conductive epoxy. Electrode 13 is also connected to this arm of the transmission line. Electrode 11 is connected to utilization means 100 by the second arm of the transmission line which desirably comprises resistance $R_1$ which provides impedance matching between device 1 and means 100.

Figure 3:
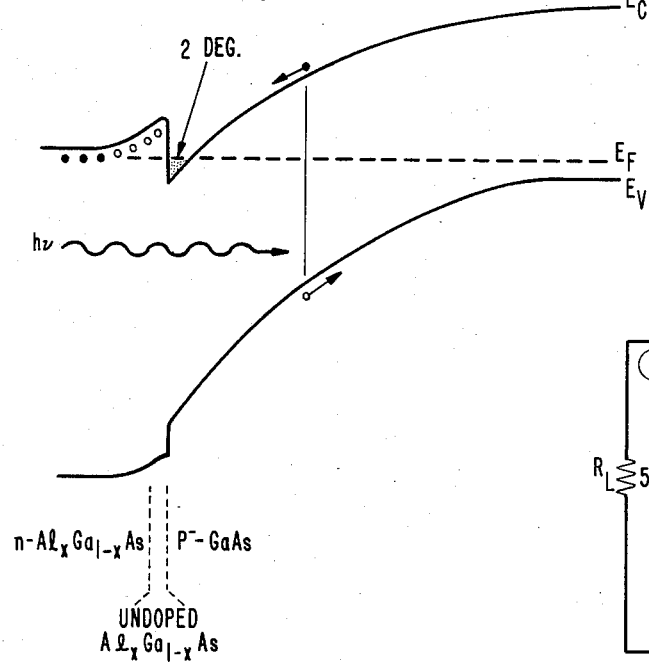
FIG. 3 illustrates the energy band diagram for a photodetector according to this invention.

The operation of an embodiment of our photodetector will be described by reference to FIG. 3. In this embodiment, layer 5 comprises p-type GaAs, layer 7 comprises nominally undoped p-type $Al_xGa_{1-x}As$ and layer 9 comprises n-type $Al_xGa_{1-x}As$. The presence of two layers having opposite conductivity types leads to formation of a p-n junction. Depicted on FIG. 3 are the valence and conduction bands indicated as $E_v$ and $E_c$, respectively, for layers 5, 7, and 9. Also depicted is the Fermi level which is the dotted line labeled $E_f$. Light, indicated as hv, is incident as shown and is absorbed in the p-type GaAs layer. The electron hole pairs generated by absorption of photons in the GaAs layer are separated by the built-in electric field with the electrons and holes moving as shown by the arrows on the solid and open circles, respectively. Electrons drifting toward the heterojunction interface are collected by either one of the two electrodes, i.e., electrodes 11 and 13, which directly contact the 2 DEG. The photogenerated holes that drift toward the semi-insulating substrate are capacitively coupled into the strip line, i.e., electrically conducting layer 15, if they are from a transient signal. The capacitive coupling may be better understood by considering that the photogenerated holes accumulated at the interface between the p-type GaAs layer and the semi-insulating GaAs substrate will induce electrons at the conductive layer 15 beneath the substrate. However, there is no external power supply to supply these electrons and they must be furnished by either electrode 11 or 13. If all the electrons were supplied by electrode 11 only, the charging time, which is a measure of the response speed of the photodetector, would be determined by the RC time constant where C is the capacitance associated with the semi-insulating substrate. Of primary importance in the embodiment depicted in FIG. 2 is the fact that electrode 13 supplies the electrons as well as electrode 11. However, electrode 13 is directly connected to the conductive layer 15 and the charging process is essentially instantaneous. It should be noted that the electrons supplied by electrode 13 do not contribute to the measured signal and thus result in a small loss in sensitivity. Layer 7, which was 80 Angstroms thick, is not required. It does, however, enhance electron mobility and improve device response time. The substrate was approximately 0.05 cm thick. In this and other embodiments, relatively thick substrates are desirable as the capacitance is reduced without requiring a reduction in the mesa area.

Figure 4:
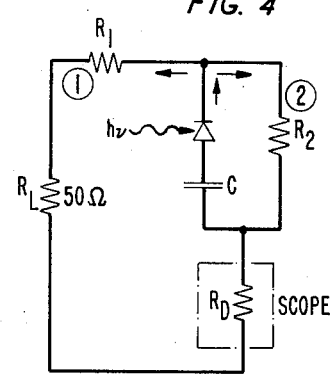
FIG. 4 is a schematic diagram of the equivalent electrical circuit of the photodetector and depicts the response of a photodetector according to this invention.

The reduction in response time resulting from the connection between electrode 13 and layer 15 may be better understood by reference to FIG. 4 which is a schematic diagram of the equivalent electrical circuit of a photodetector of this invention. The capacitance of the substrate is indicated as C white $R_1$ and $R_2$ are the resistances associated with electrodes 11 and 13, respectively. The load resistance is $R_L$, and $R_D$ is the resistance of utilization means such as an oscilloscope. It should be noted that both $R_1$ and $R_2$ depend on the resistances of both the electrodes 11 and 13 and the 2 DEG.

If $R_2$ is open, i.e., there is no electrical contact between electrode 13 and layer 15, the capacitor charges with the time constant $(R_1+R_L+R_D)C$. This term also determines the time constant of the photodetector. If $R_2$ is closed, the capacitor charges with a time constant determined by the resistance of $R_2$ which is connected in parallel with $(R_1+R_L+R_D)$ and Ca. Thus, the electrical connection between electrode 13 and layer 15 reduces the RC time constant and the photodetector time constant.

The discharge time for the capacitor does not seem to severely limit device performance as pulses that were 90 psec apart were resolved. It is hypothesized that the device was not saturated and that either many pulses of low intensity or a few pulses of high intensity would be required to saturate the device. Also, the substrate may be somewhat leaky thereby discharging the capacitor.

Devices of this invention are conveniently fabricated by molecular beam epitaxy (MBE). For example, the device may be fabricated on a Cr-doped (001) oriented semi-insulating GaAs substrate. The epitaxial growth is initiated with, for example, the 2 μm undoped GaAs layer 5 followed by an undoped $Al_{0.3}Ga_{0.7}As$, i.e., x=0.3, layer 7 which is 80 Angstroms thick and a Si-doped $Al_{0.3}Ga_{0.7}As$, i.e., x=0.7, layer a which is 600 Angstroms thick and has a doping concentration of approximately $10^{18}$ cm$^{-3}$. The nominally undoped layers have p-type conductivity with a carrier concentration of approximately $10^{14}$ cm$^{-3}$. The presence of the two-dimensional electron gas was confirmed by Hall measurements which showed an enhanced electron mobility of 6300 cm$^2$/vsec and 40,000 cm$^2$/vsec at 300° K. and 77° K., respectively. An Au-Ge alloy, which was sintered at 460° C. for approximately 3 minutes, was used for the electrodes 11 and 13, i.e., the n-type ohmic contacts. Auger electron spectroscopy suggested that the alloy penetrated the $Al_{0.3}Ga_{0.7}As$ layer and directly contacted the two-dimensional electron gas.

This electrical contact scheme has the advantage of preventing the photogenerated electrons from accumulating at the potential well.

An exemplary device has a mesa structure with an area of $3.2 \times 10^{-3}$ cm$^2$ and two contact strips, spaced 80 μm apart, each with a dimension of approximately 400 μm × 100 μm. The detector is conveniently mounted using a conductive epoxy on one arm of a 50 Ω strip line which forms the second electrode.

The zero bias electric field at the heterojunction interface was estimated, by using Gauss's law, to be $7.4 \times 10^4$ V/cm. The junction depletion region extends deeply into this layer because of the low doping level in layer 5, that is, the p-type GaAs layer. This makes the optical absorption occur in a nonzero electric field region and, therefore, results in an approved quantum efficiency and eliminates the slow diffusion process as well. The top $Al_{0.3}Ga_{0.7}As$ layer, that is layer 9, also helps reduce the surface recombination and acts as a window.

Several additional aspects of our invention should be pointed out explicitly. It has been reported that semi-insulating GaAs may be converted to p-type conductivity under high temperature treatment. The low frequency impedance of a device of the embodiment described appears to be greater than 4.0 MΩ. The impedance at the frequency of interest is expected to remain constant since the free carrier relaxation time in GaAs is subpicosecond. This relaxation time rules out the possibility of holes being collected by converted p-type GaAs substrate and with such a high impedance, the device should not show a response to a d.c. optical signal.

It should also be noted that the detected signal is not caused by a lateral field, that is, parallel to the two-dimensional electron gas, which might be introduced by either nonuniform contacts or the incident optical pulse. This was confirmed by the observation that an electrical signal still existed when contact 13 was not connected to the electrically-conductive layer 15.

The characteristics of the bias-free photodetector were measured by using 4 psec dye laser pulses, at a wavelength of 5800 Angstroms, for the response speed, and by a $Al_xGa_{1-x}As$-GaAs semiconductor laser, emitting a wavelength of 8100 Angstroms, for the sensitivity. A typical observed rise time was 30 psec and the full width at half maximum (FWHM) was 60 psec. This response speed is sufficiently fast to permit the photodetector to be employed for the alignment and monitoring of mode-locking pulses of the dye laser. Although the spacing between the two electrodes is an area having dimensions of 80 μm × 400 μm, the response speed of the photodetector was found to be unchanged with respect to the movement of the focused beam within the mesa which had a dimension of approximately 800 × 400 μm. The large mesa surface area makes alignment of the photodetector with respect to the light source simple and represents a great advantage over many other high speed photodetectors which usually have a small active area. It was also observed that the response speed was independent of the incident peak power when the incident peak power varied from 10 W to 10 mW. The device showed a sensitivity 0.04 A/W. This is not the ultimate sensitivity as the sensitivity could be improved by, for example, reducing the contact resistance or introducing an avalanche process into the device by, for example, using graded bandgap layer.

It should be noted again that if electrode 13 does not make electrical contact with the electrically conducting layer 15, the sensitivity increases by, for example, 40 percent, while the response speed is degraded to 100 psec. Furthermore, with the device depicted in FIG. 1 the negative pulse could be obtained simultaneously by taking the output from the other side of the strip line. The dual polarity output represents an additional degree of freedom in integrated circuit design. For example, the positive pulse can be employed to drive an enhancement mode FET while the negative pulse drives the depletion mode FET.

What is claimed is:

1. A photodetector comprising: a first layer comprising a first semiconductor having a first conductivity type; a second layer comprising a second semiconductor having a second conductivity type; a semi-insulating substrate; said first and second layers forming a p-n junction and being disposed on said substrate; the first of said layers having a first electrode for connection to an external electrical circuit; and a second electrode on said substrate for connection to an external electrical circuit.

2. A photodetector as recited in claim 1 in which said semi-insulating substrate has a resistivity greater than $10^7$ Ωcm.

3. A photodetector as recited in claim 2 in which said second electrode comprises an electrically conducting layer contacting said substrate.

4. A photodetector as recited in claim 3 further comprising a third electrode contacting said first layer, said third electrode being electrically connected to said electrically conducting layer.

5. A photodetector as recited in claim 4 further comprising a third epitaxial layer, said third layer having a second conductivity type and being between and contacting said first and second layers.

6. A photodetector as recited in claim 5 in which the interface between said second and third layers is inverted and an inversion layer forms.

7. A photodetector as recited in claim 6 in which at least one of said first and third electrodes electrically contacts said inversion layer.

8. A photodetector as recited in claim 2, 4, 5, or 7 in which said substrate comprises a Group III–V compound.

9. A photodetector as recited in claim 8 in which said compound is selected from the group consisting of InP and GaAs.

10. A photodetector as recited in claim 8 in which said first conductivity type is n-type.

11. A photodetector as recited in claim 10 in which said first layer comprises a Group III–V compound.

12. A photodetector as recited in claim 11 in which said compound is selected from the group consisting of $In_xGa_{1-x}As_yP_{1-y}$ and $Al_xGa_{1-x}As$.

13. A photodetector as recited in claim 12 in which said second layer comprises $Al_xGa_{1-x}As$.

14. A photodetector as recited in claim 13 further comprising a third epitaxial layer comprising a third semiconductor having a second conductivity type, said third layer being disposed on said second layer.

15. A photodetector as recited in claim 2 in which said substrate comprises a Group II–VI compound.

16. A photodetector as recited in claim 15 in which said first and second layers comprise Group II–VI compounds.

17. A photodetector as recited in claim 2 in which said first and second layers comprise Group III–V compounds.

* * * * *